United States Patent
Yu et al.

(10) Patent No.: US 11,002,249 B2
(45) Date of Patent: May 11, 2021

(54) PRIMARY FREQUENCY MODULATION METHOD AND DEVICE FOR WIND TURBINE

(71) Applicant: BEIJING GOLDWIND SCIENCE & CREATION WINDPOWER EQUIPMENT CO., LTD., Beijing (CN)

(72) Inventors: Mengting Yu, Beijing (CN); Mei Han, Beijing (CN)

(73) Assignee: BEIJING GOLDWIND SCIENCE & CREATION WINDPOWER EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/345,119

(22) PCT Filed: Jul. 10, 2018

(86) PCT No.: PCT/CN2018/095167
§ 371 (c)(1),
(2) Date: Apr. 25, 2019

(87) PCT Pub. No.: WO2019/148771
PCT Pub. Date: Aug. 8, 2019

(65) Prior Publication Data
US 2019/0338752 A1     Nov. 7, 2019

(30) Foreign Application Priority Data
Jan. 31, 2018 (CN) .......................... 201810098153.2

(51) Int. Cl.
*F03D 7/02* (2006.01)
*G01R 23/00* (2006.01)
*F03D 7/04* (2006.01)

(52) U.S. Cl.
CPC ........... *F03D 7/0284* (2013.01); *F03D 7/047* (2013.01); *G01R 23/005* (2013.01)

(58) Field of Classification Search
CPC ......... F03D 7/0284; G01R 23/00; H02J 3/241
(Continued)

(56) References Cited

U.S. PATENT DOCUMENTS

| | | | |
|---|---|---|---|
| 2011/0012352 A1* | 1/2011 | Nelson | F03D 7/043 290/44 |
| 2011/0031748 A1 | 2/2011 | Arinaga et al. | |

(Continued)

FOREIGN PATENT DOCUMENTS

| | | |
|---|---|---|
| CN | 102709906 A | 10/2012 |
| CN | 103441722 A | 12/2013 |

(Continued)

OTHER PUBLICATIONS

International Search Report dated Dec. 10, 2018; PCT/CN2018/095167.

(Continued)

*Primary Examiner* — Charles Reid, Jr.

(57) ABSTRACT

The present disclosure provides a primary frequency modulation method for a wind turbine, which may include: detecting a current frequency of a power grid; determining an instruction value of a power change amount for a primary frequency modulation by a first determining process when the current frequency of the power grid is less than a standard frequency of the power grid, wherein the first determining process may include: determining a reference value of the power change amount for the primary frequency modulation based on the current frequency; and when it is determined that currently there is an active power headroom for the wind turbine, comparing the reference value with a current active power headroom value of the wind turbine (Continued)

and determining the instruction value of the power change amount for the primary frequency modulation; and performing the primary frequency modulation based on the instruction value of the power change amount.

19 Claims, 2 Drawing Sheets

(58) Field of Classification Search
USPC .................................................. 290/44, 55
See application file for complete search history.

(56) References Cited

U.S. PATENT DOCUMENTS

| | | | |
|---|---|---|---|
| 2011/0057445 A1 | 3/2011 | Acedo Sanchez et al. | |
| 2012/0061961 A1* | 3/2012 | Yasugi | F03D 9/255 290/44 |
| 2012/0203384 A1 | 8/2012 | Arlaban Gabeiras et al. | |
| 2015/0137519 A1* | 5/2015 | Tarnowski | F03D 7/048 290/44 |
| 2016/0160839 A1* | 6/2016 | Wang | F03D 9/255 290/44 |

FOREIGN PATENT DOCUMENTS

| | | |
|---|---|---|
| CN | 106300394 A | 1/2017 |
| CN | 106374496 A | 2/2017 |
| CN | 106655206 A | 5/2017 |
| CN | 107152377 A | 9/2017 |
| CN | 107370177 A | 11/2017 |
| EP | 1275822 A2 | 1/2003 |
| WO | 2012/163355 A1 | 12/2012 |
| WO | 2013/010332 A1 | 1/2013 |

OTHER PUBLICATIONS

Jizhen Liu, et al; "Wind Farm Primary Frequency Control Strategy Based on Wind & Thermal Power Joint Control", Proceedings of the CSEE, vol. 37, No. 12, Jun. 20, 2017; 9 pages.
M. El Modadem, et al; "Experimental Study of Wind Generator Participation to Primary Frequency Control", Experimental Study of Wind Generator Participation to Primary Frequency Control; Electrical Machines and Power Electronics, 2007. ACEMP 07. International Segean Conference on, IEEE, Sep. 10, 2007; pp. 719-724; XP031248058.
M. El Mokadem, et al; "Experimental study of variable speed wind generator contribution to primary frequency control", Renewable Energy 34; pp. 833-844; Available online Jul. 17, 2008.
Vincent Courtecuisse, et al; "Fuzzy logic based primary frequency control of variable speed wind generators", Powereng; Apr. 12-14, 2007; 6 pages.
German Claudio Tarnowski; "Coordinated Frequency Control of Wind Turbines in Power Systems with High Wind Power Penetration", PhD Thesis, Nov. 2011, Technical University of Denmark, 289 pages.
Australian Second Examination Report; Appin. No. 2018353933; dated May 8, 2020.
First Chinese Office Action dated May 25, 2020; Appln. No. 201810098153.2.
Extended European Search Report dated Jun. 26, 2020; Appln. No. 18867306.5.
Xiao-Rong Zhu, et al; "Composite frequency control strategy of doubly-fed induction generator wind turbines", Power System Protection and Control, vol. 40, No. 8, Apr. 16, 2012, 7 pages.
The 3rd Chinese Office Action, dated Dec. 28, 2020; Appln. No. 201810098153.2; *English Concise Explanation of Relevance for CNOA3.

* cited by examiner

PRIMARY FREQUENCY MODULATION METHOD AND DEVICE FOR WIND TURBINE

CROSS-REFERENCE TO RELATED APPLICATION

This application is a National Stage of International Application No. PCT/CN2018/095167, filed Jul. 10, 2018, which claims priority to Chinese Patent Application No. 201810098153.2, filed Jan. 31, 2018, both of which are hereby incorporated by reference in their entireties.

FIELD

The present disclosure relates to the field of control technology of wind power generation systems, and in particular, to a primary frequency modulation method and device for a wind turbine.

BACKGROUND

With the continuous increase of wind power installed capacity, the impact of operating characteristics of a wind turbine on frequency stability of a power system is increasingly apparent.

Since a wind turbine often operates in a power-limited state and cannot be in an optimal power generation state for a long time, a control technology capable of performing a primary frequency modulation in a power-limited state is needed.

SUMMARY

The present disclosure provides a primary frequency modulation method and device for a wind turbine, to enhance primary frequency modulation capability and system stability of the wind turbine.

According to an aspect of the present disclosure, there is provided a primary frequency modulation method for a wind turbine including: detecting a current frequency of a power grid; determining an instruction value of a power change amount for a primary frequency modulation by a first determining process when the current frequency of the power grid is less than a standard frequency of the power grid, wherein the first determining process may include: determining a reference value of the power change amount for the primary frequency modulation based on the current frequency; and when it is determined that currently there is an active power headroom for the wind turbine, comparing the reference value with a current active power headroom value of the wind turbine and determining the instruction value of the power change amount for the primary frequency modulation; and performing the primary frequency modulation based on the instruction value of the power change amount.

According to another aspect of the present disclosure, there is provided a primary, frequency modulation device for a wind turbine including: a detection unit configured to detect a current frequency of a power grid; a determination unit configured to determine an instruction value of a power change amount for a primary frequency modulation by a first determining process when the current frequency of the power grid is less than a standard frequency of the power grid, wherein the determination unit is further configured to: determine a reference value of the power change amount for the primary frequency modulation based on the current frequency; and when it is determined that currently there is an active power headroom for the wind turbine, compare the reference value with a current active power headroom value of the wind turbine and determine the instruction value of the power change amount for the primary frequency modulation; and a frequency modulation unit configured to perform the primary frequency modulation based on the instruction value of the power change amount.

According to another aspect of the present disclosure, there is provided a computer readable storage medium storing a computer program that, when executed by a processor, causes the processor to perform the primary frequency modulation method as described above.

According to another aspect of the present disclosure, there is provided a computing device including: a processor; and a memory for storing a computer program, that when executed by a processor, causes the processor to perform the primary frequency modulation method as described above.

BRIEF DESCRIPTION OF THE DRAWINGS

The features and advantages of the present disclosure will become more apparent from the detailed description below with reference to the drawings, wherein.

DETAILED DESCRIPTION

Embodiments of the present disclosure will be described in detail below with reference to the drawings.

Figure 1:
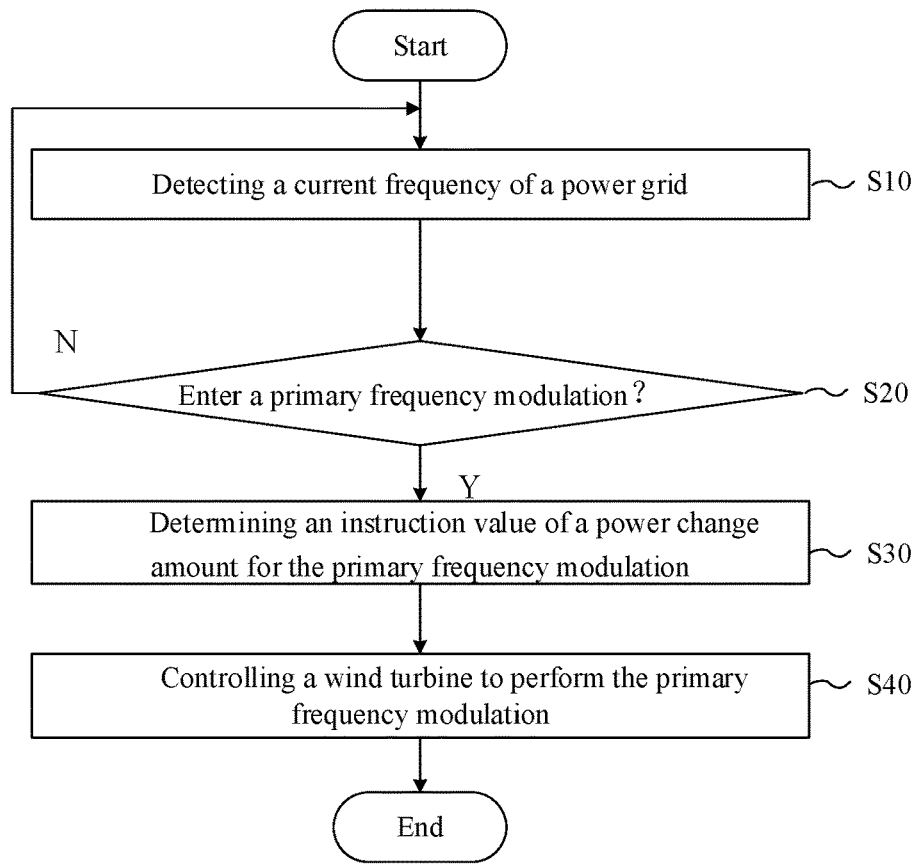
FIG. 1 is a flow chart showing a primary frequency modulation method for a wind turbine according to an embodiment of the present disclosure.

FIG. 1 is a flow chart showing a primary frequency modulation method for a wind turbine according to an embodiment of the present disclosure.

In step S10, a current frequency of a power grid may be detected. The current frequency of the power grid may be detected in real time herein.

In step S20, whether the wind turbine needs to enter a primary frequency modulation may be determined.

The present disclosure does not limit the manner in which whether the wind turbine needs to enter the primary frequency modulation is determined, and whether the wind turbine needs to enter the primary frequency modulation may be determined in various manners.

As an example, a frequency deviation between the current frequency of the power grid and a standard frequency of the power grid may be calculated, and whether the frequency deviation exceeds a frequency dead zone may be determined. By determining whether the frequency deviation exceeds the frequency dead zone, whether the primary frequency modulation is required may be determined. When the frequency deviation does not exceed the frequency dead zone, it may not necessary to perform the primary frequency modulation, and the process may return to step S10 to continue to detect the current frequency of the power grid. When the frequency deviation exceeds the frequency dead zone, it may be necessary to perform the primary frequency modulation, and step S30 may be performed.

The standard frequency of the power grid may refer to a standard AC power supply frequency of the power grid. The standard frequency of the power grid for different countries or regions may be different. For example, the standard frequency of the power grid in China is 50 HZ, and the standard frequency of the power grid in U.S. is 60 HZ. The frequency dead zone may refer to an allowable fluctuation range of the frequency deviation between a frequency of the power grid and the standard frequency of the power grid.

In step S30, an instruction value of a power change amount for the primary frequency modulation may be determined. In step S40, the wind turbine may be controlled to perform the primary frequency modulation based on the instruction value of the power change amount for the primary frequency modulation.

In some embodiments, the instruction value of the power change amount for the primary frequency modulation may refer to an amount of change in a specified value of an active power output by the wind turbine at the time of the primary frequency modulation relative to a current output power (i.e., an output power before entering the primary frequency modulation) of the wind turbine.

In the prior art, an amount of change in a power output by the wind turbine required to balance the frequency deviation described above (i.e., a reference value of the power change amount for the primary frequency modulation, hereinafter referred to as the reference value) may generally be used as the instruction value of the power change amount for the primary frequency modulation. In the present disclosure, when the reference value is a positive number, namely, when the output power needs to be increased at the time of the primary frequency modulation, the instruction value may be determined based on an active power headroom value and the reference value.

Specifically, when the current frequency is less than the standard frequency of the power grid, the instruction value of the power change amount for the primary frequency modulation may be determined by a first determining process. When the current frequency of the power grid is less than the standard frequency of the power grid, it may indicate that the load of the power grid system increases, and the wind turbine may need to increase the output power accordingly, to balance the power generation amount with the load of the power grid system.

As an example, the first determining process may include: determining the reference value based on the current frequency; and when it is determined that currently there is an active power headroom for the wind turbine, comparing a current active power headroom value of the wind turbine and the reference value, and determining the instruction value of the power change amount for the primary frequency modulation. The reference value described above may be determined based on the current frequency, and the determination method will be described in detail later.

It will be understood by those skilled in the art that whether there is an active power headroom for the wind turbine currently may be determined in various ways.

As an example, whether there is an active power headroom for the wind turbine currently may be determined by detecting a current pitch angle of the wind turbine. For example, when the current pitch angle of the wind turbine is greater than or equal to a minimum value of a pitch angle at which pitch control is initiated, it is determined that currently there is an active power headroom for the wind turbine; and when the current pitch angle of the wind turbine is less than a minimum value of a pitch angle at which pitch control is initiated, it is determined that currently there is no active power headroom for the wind turbine. Since pitch angles of three blades of the wind turbine are substantially the same, the current pitch angle of any blade may be used as the current pitch angle of the wind turbine, or the average of the current pitch angles of the three blades may be used as the current pitch angle of the wind turbine.

When it is determined that currently there is an active power headroom for the wind turbine, a current active power headroom value may be determined, and the smaller value of the reference value and the current active power headroom value may be determined as the instruction value of the power change amount for the primary frequency modulation.

Specifically, when the active power headroom value is less than the reference value, it may indicate that the current active power headroom value of the wind turbine may not meet the requirement of balancing the above frequency deviation, then first the wind turbine should be guaranteed to operate stably, and secondly, the frequency modulation power may be provided to the maximum extent. Therefore, in this case, the instruction value of the power change amount for the primary frequency modulation should be the active power headroom value.

When the active power headroom value is greater than or equal to the reference value, it may indicate that the current active power headroom value of the wind turbine may meet the requirement of balancing the above frequency deviation, then the wind turbine may provide the frequency modulation power based on the reference value. Therefore, in such a case, the instruction value of the power change amount for the primary frequency modulation should be the reference value.

It will be understood by those skilled in the art that the current active power headroom value of the wind turbine may be determined in various ways.

As an example, the current active power headroom value may be determined based on a current pitch angle, a proportional integral (PI) controller transfer function, and a minimum value of a pitch angle at which pitch control is initiated. The PI controller transfer function may indicate a correspondence relationship among an active power headroom value, a current pitch angle and the minimum value.

As an example, the PI controller transfer function may be as shown in equation (1) below:

$$\Delta P_{pre} = K_p(\beta - \beta_{min}) + K_i \int_0^t (\beta - \beta_{min}) dt \tag{1}$$

wherein $\Delta P_{pre}$ may represent an active power headroom value, $K_p$ may represent a proportional coefficient, $K_i$ may represent an integral coefficient, $\beta$ may represent a current pitch angle, and $\beta_{min}$ may represent a minimum value of a pitch angle at which pitch control is initiated.

The present disclosure does not limit the manner in which the current active power headroom value is determined, and the current active power headroom value may be determined in other manners.

The method of determining the above reference value based on the current frequency will be described in detail below.

As an example, the reference value may be obtained based on a mapping relationship between reference values and current frequencies. The mapping relationship may be obtained based on historical empirical data or experimental data, or may be obtained based on corresponding power grid guidelines. The present disclosure does not limit the manner in which the reference value is determined, and the above reference value may be determined in other manners.

In the first determining process described above, when it is determined that currently there is no active power headroom for the wind turbine, the instruction value of the power change amount for the primary frequency modulation may be determined in various manners. For example, the reference value may be used as the instruction value of the power change amount for the primary frequency modulation. The present disclosure does not limit the manner in which the above instruction value is determined, and the above instruction value may also be determined in other manners.

In step S30, when the current frequency of the power grid is greater than the standard frequency of the power grid, it may indicate that the load of the power grid system is reduced, and the wind turbine may need to reduce the output power accordingly, to balance the power generation amount with the load of the power grid system. Therefore, an active power headroom may not be necessary to participate in the primary frequency modulation. In this case, the instruction value of the power change amount for the primary frequency modulation may be determined in various second determining processes different from the first determining process. For example, the reference value may be determined based on the current frequency, and the reference value may be used as the instruction value of the power change amount for the primary frequency modulation. The present disclosure does not limit the second determining processes, and the above instruction value may also be determined in other manners.

After determining the instruction value of the power change amount for the primary frequency modulation, the wind turbine may be controlled to perform the primary frequency modulation based on the instruction value of the power change amount for the primary frequency modulation. That is to say, the wind turbine may be controlled to perform the primary, frequency modulation so that the output power of the wind turbine is a sum of the current output power (i.e., the output power before entering the primary frequency modulation) and the instruction value (hereinafter referred to as a first power).

In some embodiments, the wind turbine may be controlled to perform the primary frequency modulation in accordance with an existing frequency modulation method to cause the wind turbine to output the first power. However, the existing frequency modulation method has a problem that the frequency modulation speed is slow or the power generation benefit of the wind farm needs to be sacrificed.

In a preferred embodiment, the frequency modulation method for the wind turbine according to an embodiment of the present disclosure may also improve the specific frequency modulation manners.

For example, when the current frequency of the power grid is less than the standard frequency of the power grid and currently there is an active power headroom for the wind turbine, or when the current frequency of the power grid is greater than the standard frequency of the power grid, the primary frequency modulation may be performed by a first frequency modulation process, which may include: performing torque control and pitch control on the wind turbine based on the instruction value of the power change amount for the primary frequency modulation.

In some embodiments, the first frequency modulation process may be performed based on a predetermined length of time. The predetermined length of time may indicate the duration of the first frequency modulation process. For the first frequency modulation process, the predetermined length of time may be set based on the predicted amount of active power headroom. The active power headroom may be predicted based on predictions of wind resources.

Herein, the torque control may refer to a specified torque value for adjusting the wind turbine, and the pitch control may refer to a pitch angle for controlling the wind turbine. In the first frequency modulation process, the wind turbine may output the first power by simultaneously controlling a rotor torque of the wind turbine and controlling the pitch angle of the wind turbine, so that not only the frequency change response speed may be accelerated by the torque control, but also release of rotational kinetic energy of a rotor or absorption of the frequency modulation power may be supplemented by the pitch control, thereby maintaining stable operation of the wind turbine for a long time.

In some embodiments, a first specified torque value may be calculated based on the first power and a rotor speed of the wind turbine, and then the specified torque value of the wind turbine may be adjusted to the first specified torque value.

The first specified torque value may be calculated by the folk equation (2):

$$T_f = \frac{P_{reference}}{\Omega} \quad (2)$$

wherein $T_f$ may represent the first specified torque value, $P_{reference}$ may represent the first power, and $\Omega$ may represent a linear velocity of a rotor of the wind turbine.

The present disclosure does not limit the manner in which the first specified torque value is determined, and the first specified torque value described above may also be determined in other manners.

In order to reduce the workload of the design, both a maximum output limit and a minimum output limit of an existing PI controller for controlling a torque of the wind turbine may be set to the first specified torque value, to adjust the specified torque value of the wind turbine to the first specified torque value.

In order to reduce the workload of the design, a target value of an existing PI controller for controlling a pitch angle of the wind turbine may be set to the first power, to control the pitch angle of the wind turbine.

In some embodiments, when the current frequency of the power grid is less than the standard frequency of the power grid and currently there is no active power headroom for the wind turbine, the primary frequency modulation may be performed by a second frequency modulation process different from the first frequency modulation process, and the second frequency modulation process may include: performing torque control on the wind turbine for a predetermined length of time based on the instruction value of the power change amount for the primary frequency modulation.

As an example, when currently there is no active power headroom for the wind turbine, the second frequency modulation process may be performed based on a predetermined length of time. The predetermined length of time may represent the duration of the second frequency modulation process. For the second frequency modulation process, the predetermined length of time may be set by a user.

Figure 2:
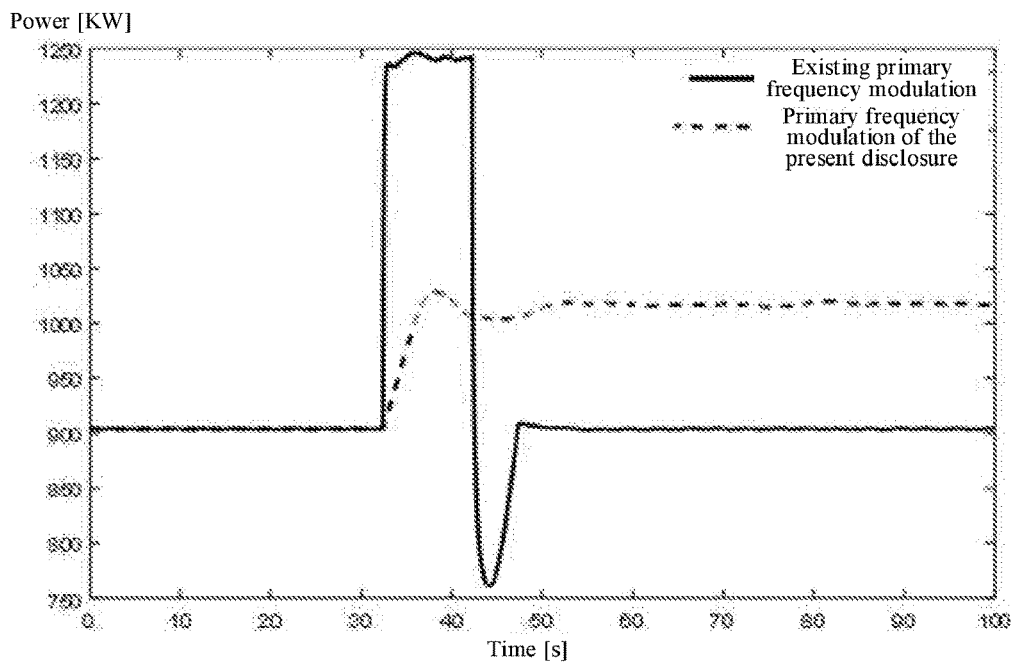
FIGS. 2 to 3 are diagrams showing simulation effects of performing a primary frequency modulation using a primary frequency modulation method for a wind turbine according to an embodiment of the present disclosure.
Figure 3:
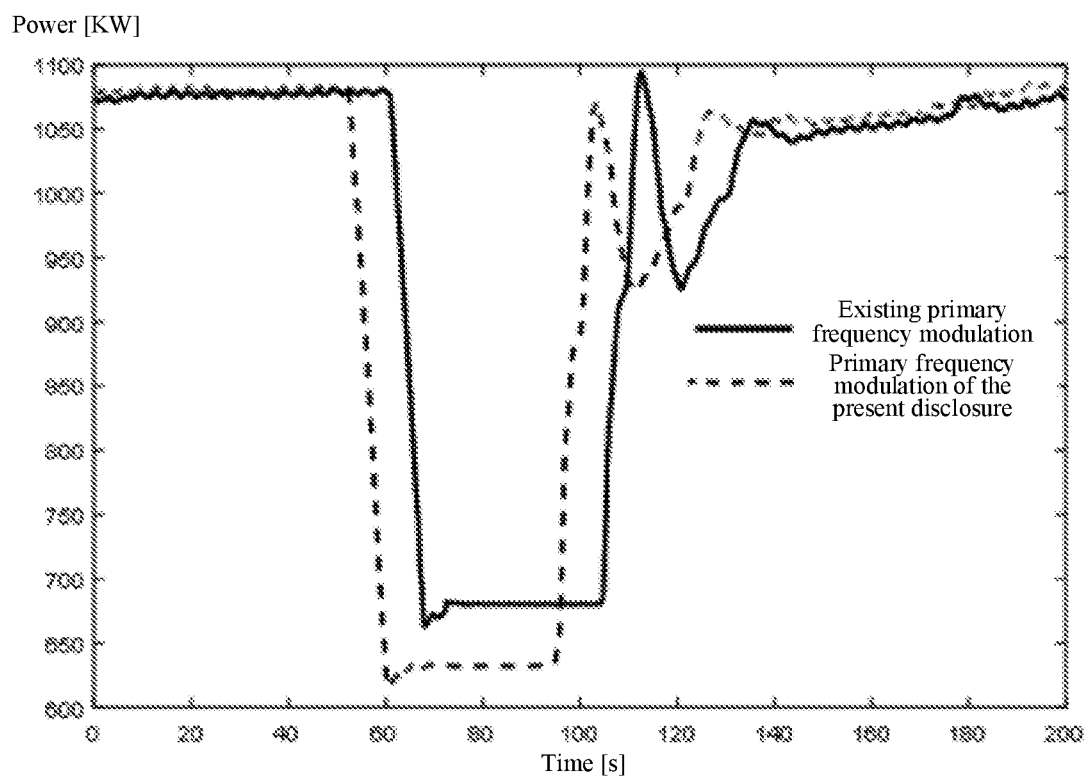

FIGS. 2 to 3 are diagrams showing simulation effects of performing a primary frequency modulation using a primary frequency modulation method for a wind turbine according to an embodiment of the present disclosure.

FIG. 2 shows a power change curve obtained after using the existing primary frequency modulation method and the primary frequency modulation method of the present disclosure when the frequency of the power grid is smaller than the standard frequency of the power grid. As shown in FIG. 2, when the existing primary frequency modulation method is used, the wind turbine responds to a primary frequency modulation instruction of the power grid as much as possible, however, after the standby inertia is exhausted, too much kinetic energy of the rotor is released so that the power of the wind turbine is rapidly decreased, at this time secondary pollution is generated for the frequency of the power grid. When the primary frequency modulation method of the present disclosure is used, although the response speed may be slightly slower than before optimization, a certain power boost can be continuously and stably provided. From the perspective of providing total energy, as long as the wind speed remains relatively stable, when using the primary frequency modulation method of the present disclosure, the wind turbine can continuously provide energy, and more importantly, the stable power boost can avoid the secondary pollution to the frequency of the power grid, while slowing down the fatigue damage caused by the rapid decline of existing power to the wind turbine.

FIG. 3 shows a power change curve obtained after using the existing primary frequency modulation method and the primary frequency modulation method of the present disclosure when the frequency of the power grid is greater than the standard frequency of the power grid. As shown in FIG. 3, when the existing primary frequency modulation method is used, since only the pitch angle control is adopted, the response is slow. In contrast, when the primary frequency modulation method of the present disclosure is used, a method combing the pitch angle control and the torque control is adopted, ensuring the rapidity and stability of the response of the wind turbine.

Figure 4:
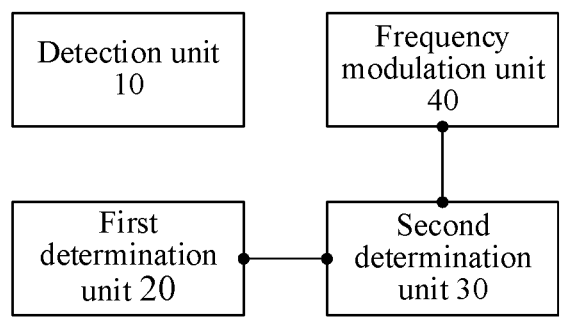
FIG. 4 is a block diagram showing a primary frequency modulation device for a wind turbine according to an embodiment of the present disclosure.

FIG. 4 is a block diagram showing a primary frequency modulation device for a wind turbine according to an embodiment of the present disclosure. The primary frequency modulation device for the wind turbine according to an embodiment of the present disclosure may include a detection unit 10, a first determination unit 20, a second determination unit 30, and a frequency modulation unit 40.

The detection unit 10 may detect a current frequency of a power grid. The detection may be real-time, or may be timed.

The first determination unit 20 may determine whether the wind turbine needs to enter a primary frequency modulation.

The present disclosure does not limit the manner in which whether the wind turbine needs to enter the primary frequency modulation is determined, and whether the wind turbine needs to enter the primary frequency modulation may be determined in various manners.

As an example, a frequency deviation between the current frequency of the power grid and a standard frequency of the power grid may be calculated, and whether the frequency deviation exceeds a frequency dead zone may be determined. By determining whether the frequency deviation exceeds the frequency dead zone, whether the primary frequency modulation is required may be determined. When the frequency deviation does not exceed the frequency dead zone, it may not necessary to perform the primary frequency modulation, and the detection unit 10 may continue to detect the current frequency of the power grid. When the frequency deviation exceeds the frequency dead zone, it may be necessary to perform the primary frequency modulation.

The standard frequency of the power grid may refer to a standard AC power supply frequency of the power grid. The standard frequency of the power grid for different countries or regions may be different. For example, the standard frequency of the power grid in China is 50 HZ, and the standard frequency of the power grid in U.S. is 60 HZ. The frequency dead zone may refer to an allowable fluctuation range of the frequency deviation between a frequency of the power grid and the standard frequency of the power grid.

The second determination unit 30 may determine an instruction value of a power change amount for the primary frequency modulation. The frequency modulation unit 40 may control the wind turbine to perform the primary frequency modulation based on the instruction value of the power change amount for the primary frequency modulation.

In some embodiments, the instruction value of the power change amount for the primary frequency modulation may refer to an amount of change in a specified value of an active power output by the wind turbine at the time of the primary frequency modulation relative to a current output power (i.e., an output power before entering the primary frequency modulation) of the wind turbine.

In the prior art, an amount of change in a power output by the wind turbine required to balance the frequency deviation described above (i.e., a reference value of the power change amount for the primary frequency modulation, hereinafter referred to as the reference value) may generally be used as the instruction value of the power change amount for the primary frequency modulation. In the present disclosure, when the reference value is a positive number, namely, when the output power needs to be increased at the time of the primary frequency modulation, the instruction value may be determined based on an active power headroom value and the reference value.

Specifically, when the current frequency is less than the standard frequency of the power grid, the instruction value of the power change amount for the primary frequency modulation may be determined by a first determining process. When the current frequency of the power grid is less than the standard frequency of the power grid, it may indicate that the load of the power grid system increases, and the wind turbine may need to increase the output power accordingly, to balance the power generation amount with the load of the power grid system.

The first determining process may include: determining the reference value based on the current frequency; and when it is determined that currently there is an active power headroom for the wind turbine, comparing a current active power headroom value of the wind turbine and the reference value, and determining the instruction value of the power change amount for the primary frequency modulation. The reference value described above may be determined based on the current frequency, and the determination method will be described in detail later.

It will be understood by those skilled in the art that whether there is an active power headroom for the wind turbine currently may be determined in various ways.

As an example, whether there is an active power headroom for the wind turbine currently may be determined by detecting a current pitch angle of the wind turbine. For example, when the current pitch angle of the wind turbine is greater than or equal to a minimum value of a pitch angle at which pitch control is initiated, it is determined that currently there is an active power headroom for the wind turbine; and when the current pitch angle of the wind turbine is less than a minimum value of a pitch angle at which pitch control is initiated, it is determined that currently there is no active power headroom for the wind turbine. Since pitch angles of three blades of the wind turbine are substantially the same, the current pitch angle of any blade may be used as the current pitch angle of the wind turbine, or the average of the current pitch angles of the three blades may be used as the current pitch angle of the wind turbine.

When it is determined that currently there is an active power headroom for the wind turbine, a current active power headroom value may be determined, and the smaller value of the reference value and the current active power headroom value may be determined as the instruction value of the power change amount for the primary frequency modulation.

Specifically, when the active power headroom value is less than the reference value, it may indicate that the current active power headroom value of the wind turbine may not meet the amount of change in the power output by the wind turbine required to balance the above frequency deviation (i.e., the reference value), then first the wind turbine should be guaranteed to operate stably, and secondly, the frequency modulation power may be provided to the maximum extent. Therefore, in this case, the instruction value of the power change amount for the primary frequency modulation should be the active power headroom value.

When the active power headroom value is greater than or equal to the reference value, it may indicate that the current active power headroom value of the wind turbine may meet the amount of change in the power output by the wind turbine required to balance the above frequency deviation (i.e., the reference value), then the wind turbine may provide the frequency modulation power based on the reference value. Therefore, in such a case, the instruction value of the power change amount for the primary frequency modulation should be the reference value.

It will be understood by those skilled in the art that the current active power headroom value of the wind turbine may be determined in various ways.

As an example, the current active power headroom value may be determined based on a current pitch angle, a proportional integral (PI) controller transfer function, and a minimum value of a pitch angle at which pitch control is initiated. The PI controller transfer function may indicate a correspondence relationship among an active power headroom value, a current pitch angle and the minimum value.

As an example, the PT controller transfer function may be as shown in equation (I) descried above.

The present disclosure does not limit the manner in which the current active power headroom value is determined, and the current active power headroom value may also be determined in other manners.

The method of determining the above reference value based on the current frequency will be described in detail below.

As an example, the reference value may be obtained based on a mapping relationship between reference values and current frequencies. The mapping relationship may be obtained based on historical empirical data or experimental data, or may be obtained based on corresponding power grid guidelines. The present disclosure does not limit the manner in which the reference value is determined, and the above reference value may be determined in other manners.

In the first determining process described above, when it is determined that currently there is no active power headroom for the wind turbine, the instruction value of the power change amount for the primary frequency modulation may be determined in various manners. For example, the reference value may be used as the instruction value of the power change amount for the primary frequency modulation. The present disclosure does not limit the manner in which the above instruction value is determined, and the above instruction value may also be determined in other manners.

When the current frequency of the power grid is greater than the standard frequency of the power grid, it may indicate that the load of the power grid system is reduced, and the wind turbine may need to reduce the output power accordingly, to balance the power generation amount with the load of the power grid system. Therefore, an active power headroom may not be necessary to participate in the primary frequency modulation. In this case, the instruction value of the power change amount for the primary frequency modulation may be determined in various second determining processes different from the first determining process. For example, the reference value may be determined based on the current frequency, and the reference value may be used as the instruction value of the power change amount for the primary frequency modulation. The present disclosure does not limit the second determining processes, and the above instruction value may also be determined in other manners.

After determining the instruction value of the power change amount for the primary frequency modulation, the wind turbine may be controlled to perform the primary frequency modulation based on the instruction value of the power change amount for the primary frequency modulation. That is to say, the wind turbine may be controlled to perform the primary frequency modulation so that the output power of the wind turbine is a sum of the current output power (i.e., the output power before entering the primary frequency modulation) and the instruction value (hereinafter referred to as a first power).

In some embodiments, the wind turbine may be controlled to perform the primary frequency modulation in accordance with an existing frequency modulation method to cause the wind turbine to output the first power. However, the existing frequency modulation method has a problem that the frequency modulation speed is slow or the power generation benefit of the wind farm needs to be sacrificed.

In a preferred embodiment, the frequency modulation method for the wind turbine according to an embodiment of the present disclosure may also improve the specific frequency modulation manners.

For example, when the current frequency of the power grid is less than the standard frequency of the power grid and currently there is an active power headroom for the wind turbine, or when the current frequency of the power grid is greater than the standard frequency of the power grid, the primary frequency modulation may be performed by a first frequency modulation process, which may include: performing torque control and pitch control on the wind turbine based on the instruction value of the power change amount for the primary frequency modulation.

In a preferred embodiment, the first frequency modulation process may be performed based on a predetermined length of time. The predetermined length of time may indicate the duration of the first frequency modulation process. For the first frequency modulation process, the predetermined length of time may be set based on the predicted amount of active power headroom.

Herein, the torque control may refer to a specified torque value for adjusting the wind turbine, and the pitch control may refer to a pitch angle for controlling the wind turbine. That is to say, in the first frequency modulation process, the wind turbine may output the first power by simultaneously controlling a rotor torque of the wind turbine and controlling the pitch angle of the wind turbine, so that not only the frequency change response speed may be accelerated by the torque control, but also release of rotational kinetic energy of a rotor or absorption of the frequency modulation power may be supplemented by the pitch control, thereby maintaining stable operation of the wind turbine for a long time.

In some embodiments, a first specified torque value may be calculated based on the first power and a rotor speed of the wind turbine, and then the specified torque value of the wind turbine may be adjusted to the first specified torque value.

The first specified torque value may be calculated by the above equation (2).

The present disclosure does not limit the manner in which the first specified torque value is determined, and the first specified torque value described above may also be determined in other manners.

In order to reduce the workload of the design, both a maximum output limit and a minimum output limit of an existing PI controller for controlling a torque of the wind turbine may be set to the first specified torque value, to adjust the specified torque value of the wind turbine to the first specified torque value.

In order to reduce the workload of the design, a target value of an existing PI controller for controlling a pitch angle of the wind turbine may be set to the first power, to control the pitch angle of the wind turbine.

As another example, when the current frequency of the power grid is less than the standard frequency of the power grid and currently there is no active power headroom for the wind turbine, the primary frequency modulation may be performed by a second frequency modulation process different from the first frequency modulation process, and the second frequency modulation process may include: performing torque control on the wind turbine for a predetermined length of time based on the instruction value of the power change amount for the primary frequency modulation. The torque control here is similar to the torque control described above and will not be repeated here.

In some embodiments, when currently there is no active power headroom for the wind turbine, the second frequency modulation process may be performed based on a predetermined length of time. The predetermined length of time may represent the duration of the second frequency modulation process. For the second frequency modulation process, the predetermined length of time may be set by a user.

Based on the primary frequency modulation method for the wind turbine according to an embodiment of the present disclosure, when the current frequency of the power grid is less than the standard frequency of the power grid, the instruction value of the power change amount for the primary frequency modulation may be determined by taking into account the active power headroom value of the wind turbine and the current frequency. Under the premise of ensuring the stable operation of the wind turbine, the active power headroom is participated in the primary frequency modulation process of the system to the maximum extent, thereby enhancing the frequency modulation capability and system stability of the wind turbine, while increasing the auxiliary benefit of the wind farm grid.

In addition, based on the primary frequency modulation method for the wind turbine according to an embodiment of the present disclosure, the primary frequency modulation may be performed by combining with the torque control and the pitch control, that is to say, the torque control may be used to accelerate the response of the wind turbine to the frequency change of the power grid, and at the same time, the ability to absorb or release the rotational kinetic energy in the torque control may be supplemented by the pitch control, avoiding rapid changes in the wind turbine speed, thereby ensuring stable operation of the wind turbine during the primary frequency modulation.

A computer readable storage medium is also provided in accordance with an embodiment of the present disclosure. The computer readable storage medium may store a computer program that, when executed by a processor, causes the processor to perform the primary frequency modulation method as described above.

A computing device is also provided in accordance with an embodiment of the present disclosure. The computing device may include a processor and a memory. The memory may be used to store program instructions. The program instructions may be executed by a processor such that the processor may execute a computer program of the primary frequency modulation method as described above.

In addition, each program module in the primary frequency modulation device according to an embodiment of the present disclosure may be implemented entirely by hardware, such as a field programmable gate array or an application specific integrated circuit, or may be implemented by a combination of hardware and software, or may also be implemented in software processing entirely through a computer program.

Although the present disclosure has been particularly shown and described with reference to the exemplary embodiments thereof, those skilled in the art will appreciate that various changes in form and detail may be made without departing from the spirit and scope of the present disclosure as defined by the appended claims.

What is claimed is:

1. A primary frequency modulation method for a wind turbine, the primary frequency modulation method comprises:
   detecting a current frequency of a power grid;
   determining an instruction value of a power change amount for a primary frequency modulation by a first determining process when the current frequency of the power grid is less than a standard frequency of the power grid, wherein the first determining process comprises: determining a reference value of the power change amount for the primary frequency modulation based on the current frequency; and when there is an active power headroom for the wind turbine, determining the instruction value of the power change amount for the primary frequency modulation based on the reference value and a current active power headroom value of the wind turbine; and
   performing the primary frequency modulation based on the instruction value of the power change amount.

2. The primary frequency modulation method of claim 1, wherein determining the instruction value of the power change amount for the primary frequency modulation based on the reference value and the current active power headroom value of the wind turbine comprises: determining a smaller value of the reference value and the current active power headroom value as the instruction value of the power change amount for the primary frequency modulation.

3. The primary frequency modulation method of claim 1, wherein the current active power headroom value is determined based on a current pitch angle, a proportional integral controller transfer function, and a minimum value of a pitch angle at which a pitch control is initiated, wherein the proportional integral controller transfer function indicates a correspondence relationship among an active power headroom value, the current pitch angle and the minimum value.

4. The primary frequency modulation method of claim 1, wherein the first determining process further comprises: when there is no active power headroom for the wind turbine, determining the reference value as the instruction value of the power change amount for the primary frequency modulation.

5. The primary frequency modulation method of claim 1, wherein determining the reference value based on the current frequency comprises: obtaining the reference value based on a mapping relationship between reference values and current frequencies.

6. The primary frequency modulation method of claim 1, wherein when a current pitch angle of the wind turbine is greater than or equal to a minimum value of a pitch angle at which a pitch control is initiated, there is the active power headroom for the wind turbine.

7. The primary frequency modulation method of claim 1, wherein performing the primary frequency modulation based on the instruction value of the power change amount comprises: performing the primary frequency modulation by a first frequency modulation process, when the current frequency of the power grid is less than the standard frequency and currently there is the active power headroom for the wind turbine, or when the current frequency of the power grid is greater than the standard frequency,
wherein the first frequency modulation process comprises: performing a torque control and a pitch control on the wind turbine based on the instruction value of the power change amount for the primary frequency modulation.

8. The primary frequency modulation method of claim 7, wherein performing the primary frequency modulation based on the instruction value of the power change amount comprises: performing the primary frequency modulation by a second frequency modulation process, when the current frequency of the power grid is less than the standard frequency and currently there is no active power headroom for the wind turbine,
wherein the second frequency modulation process comprises: performing the torque control on the wind turbine based on the instruction value of the power change amount for the primary frequency modulation.

9. The primary frequency modulation method of claim 8, wherein the first frequency modulation process or the second frequency modulation process is performed based on a predetermined length of time.

10. A computer readable storage medium storing a computer program, that when executed by a processor, causes the processor to perform the primary frequency modulation method of claim 1.

11. A primary frequency modulation device for a wind turbine, the primary frequency modulation device comprises:
a processor; and
a memory for storing instructions executable by the processor;
wherein the processor is configured to:
detect a current frequency of a power grid;
determine an instruction value of a power change amount for a primary frequency modulation by a first determining process when the current frequency of the power grid is less than a standard frequency of the power grid, wherein the processor is further configured to: determine a reference value of the power change amount for the primary frequency modulation based on the current frequency; and
when there is an active power headroom for the wind turbine, determine the instruction value of the power change amount for the primary frequency modulation based on the reference value with a current active power headroom value of the wind turbine; and
perform the primary frequency modulation based on the instruction value of the power change amount.

12. The primary frequency modulation device of claim 11, wherein the processor is further configured to: determine a smaller value of the reference value and the current active power headroom value as the instruction value of the power change amount for the primary frequency modulation.

13. The primary frequency modulation device of claim 11, wherein the processor is further configured to determine the current active power headroom value based on a current pitch angle, a proportional integral controller transfer function, and a minimum value of a pitch angle at which a pitch control is initiated,
wherein the proportional integral controller transfer function indicates a correspondence relationship among an active power headroom value, the current pitch angle and the minimum value.

14. The primary frequency modulation device of claim 11, wherein the processor is further configured to: when there is no active power headroom for the wind turbine, determine the reference value as the instruction value of the power change amount for the primary frequency modulation.

15. The primary frequency modulation device of claim 11, wherein the processor is further configured to obtain the reference value based on a mapping relationship between reference values and current frequencies.

16. The primary frequency modulation device of claim 11, wherein the processor is further configured to determine that currently there is the active power headroom for the wind turbine, when a current pitch angle of the wind turbine is greater than or equal to a minimum value of a pitch angle at which a pitch control is initiated.

17. The primary frequency modulation device of claim 11, wherein the processor is further configured to: perform the primary frequency modulation by a first frequency modulation process, when the current frequency of the power grid is less than the standard frequency and currently there is the active power headroom for the wind turbine, or when the current frequency of the power grid is greater than the standard frequency,
wherein the processor is further configured to: perform a torque control and a pitch control on the wind turbine based on the instruction value of the power change amount for the primary frequency modulation.

18. The primary frequency modulation device of claim 17, wherein the processor is further configured to: perform the primary frequency modulation by a second frequency modulation process, when the current frequency of the power grid is less than the standard frequency and currently there is no active power headroom for the wind turbine,
wherein the processor is further configured to: perform the torque control on the wind turbine based on the instruction value of the power change amount for the primary frequency modulation.

19. The primary frequency modulation device of claim 18, wherein the processor is further configured to perform the first frequency modulation process or the second frequency modulation process based on a predetermined length of time.

\* \* \* \* \*